US011018141B2

(12) United States Patent
Chang et al.

(10) Patent No.: US 11,018,141 B2
(45) Date of Patent: May 25, 2021

(54) CONTACTS AND METHOD OF MANUFACTURING THE SAME

(71) Applicants: UNITED MICROELECTRONICS CORP., Hsin-Chu (TW); Fujian Jinhua Integrated Circuit Co., Ltd., Quanzhou (CN)

(72) Inventors: Feng-Yi Chang, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/011,652

(22) Filed: Jun. 19, 2018

(65) Prior Publication Data
US 2019/0051654 A1 Feb. 14, 2019

(30) Foreign Application Priority Data
Aug. 8, 2017 (CN) .......................... 201710669727.2

(51) Int. Cl.
*H01L 27/108* (2006.01)
(52) U.S. Cl.
CPC .. *H01L 27/10888* (2013.01); *H01L 27/10855* (2013.01); *H01L 27/10885* (2013.01); *H01L 27/10891* (2013.01)
(58) Field of Classification Search
CPC ......... H01L 27/10888; H01L 27/10855; H01L 27/10885; H01L 27/10891; H01L 27/10847; H01L 27/10805
See application file for complete search history.

(56) References Cited

U.S. PATENT DOCUMENTS

| 6,551,877 | B1 * | 4/2003 | Wu | H01L 21/76897 |
| | | | | 257/E21.507 |
| 9,627,387 | B2 | 4/2017 | Jung | |
| 2012/0187535 | A1 * | 7/2012 | Lee | H01L 27/10855 |
| | | | | 257/532 |
| 2013/0154101 | A1 * | 6/2013 | Park | H01L 27/10855 |
| | | | | 257/773 |
| 2013/0171818 | A1 * | 7/2013 | Kim | H01L 21/76843 |
| | | | | 438/664 |
| 2014/0134812 | A1 * | 5/2014 | Kim | H01L 21/28185 |
| | | | | 438/270 |
| 2016/0181258 | A1 | 6/2016 | Seo | |

FOREIGN PATENT DOCUMENTS

| CN | 101154031 A | 4/2008 |
| CN | 101315903 A | 12/2008 |
| KR | 10-2012-0004109 | 1/2012 |

* cited by examiner

*Primary Examiner* — Thanh Y. Tran
(74) *Attorney, Agent, or Firm* — Winston Hsu

(57) ABSTRACT

A method of manufacturing contacts is provided in the present invention, which include the steps of forming a plurality of mask bars on a substrate, forming a circular mask surrounding each mask bar, wherein the circular masks connect each other and define a plurality of opening patterns collectively with the mask bars, using the mask bars and the circular masks as etch masks to perform an etch process and to transfer the opening patterns and form a plurality recesses in the substrate, and filling up the recesses with metal to form contacts.

4 Claims, 10 Drawing Sheets

CONTACTS AND METHOD OF MANUFACTURING THE SAME

BACKGROUND OF THE INVENTION

1. Field of the Invention

The present invention relates generally to contacts and method of manufacturing the same, and more specifically, to bit line contacts and storage node contacts in dynamic random access memory (DRAM) and method of manufacturing the same.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. The capacitor in DRAM electrically connects with a capacitor landing pad through its bottom electrode, and further electrically connects to the drain of transistor through a storage node contact and a contact pad. Bit lines and word lines are buried within the substrate, wherein bit line is electrically connected to the source of transistor through a bit line contact, while word line serves as a gate for storage units.

With the rapid increase in the degree of integration on the DRAM, the size of the capacitor landing pad is also smaller. However, due to the bottleneck of the process technology, an unexpected misalignment situation often occurs at the exposure step used to define the location of the capacitor landing pad. The error margin is very small, resulting in the subsequent short circuit between the capacitor landing pads and the bit lines when the capacitor landing pads are formed. Furthermore, for current recessed DRAM structure, the bit line contact would go deeper than surrounding components (ex. storage node contact). In order to achieve this depth, the time period of corresponding etch process would be longer than normal etch process. This approach is prone to damage sensitive layer structures, such as the gate dielectric layer already formed in the peripheral region.

Therefore, there still exist many defects in the manufacturing process of the DRAM cell with the buried gate structure, and the efficiency and reliability of the related memory device need to be further improved.

SUMMARY OF THE INVENTION

In order to solve the problems prone to happen in DRAM process as described above, novel contacts and a method of manufacturing the same are provided in the present invention, which features the bit line contacts and storage node contacts defined and formed by self-alignment method to prevent short-circuit issue in prior art caused from the electrical connection of bit line contacts and storage node contacts formed thereafter. In addition, since the two kinds of contacts are simultaneously formed, the bit line contact and the storage node contact would have the same depth so that long-period etch process is not necessary to ensure that layer structures in peripheral region would not suffer damage.

One aspect of the present invention is to provide a method of manufacturing contacts, which includes the steps of providing multiple mask bars on a substrate, forming a circular mask around each mask bar, wherein the circular masks connect with each other and define multiple opening patterns collectively with the mask bars, performing an etch process using the mask bars and the circular masks as etch masks to transfer the opening patterns to the substrate and to form multiple recesses in the substrate, and filling every recess with metal to form contacts connecting with active areas in the substrate.

Another aspect of the present invention is to a provide contact including a substrate with multiple active areas isolated by shallow trench isolations, multiple bit line contacts in the substrate and connecting with the active areas, and multiple storage node contacts in the substrate and connecting with the active areas and the shallow trench isolations, wherein storage node contacts are provided at two sides of each bit line contact, and the bottom of storage node contact is level with the bottom of bit line contact.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1A:
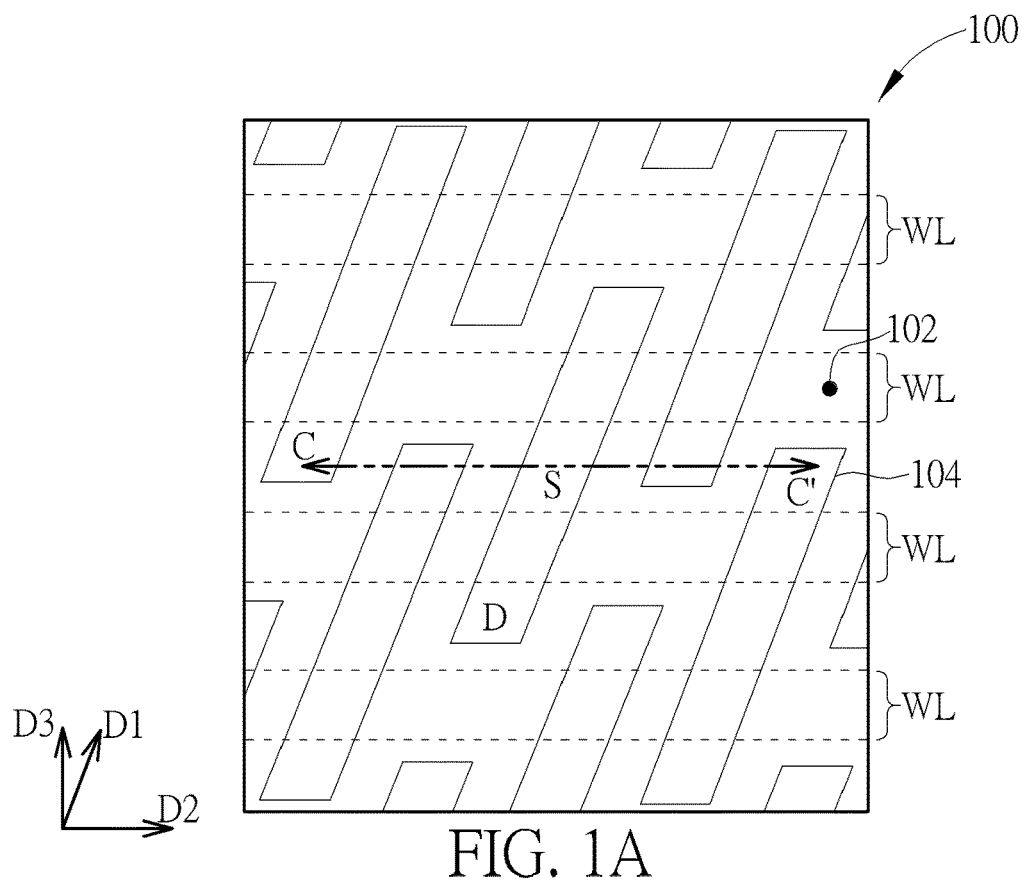
FIG. 1A, FIG. 2A, FIG. 3A, FIG. 4A, FIG. 5A, FIG. 6A, FIG. 7A, FIG. 9A and FIG. 10A are schematic top views sequentially illustrating the process steps of manufacturing contacts in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention. In the drawings, the size and relative sizes of components and regions may be exaggerated for clarity unless express so defined herein. It is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Before describing the preferred embodiment, the following description will be given for specific terms used throughout the specification. The term "etch" or "etching" is used herein to generally describe a fabrication process of patterning a material, such that at least a portion of the material remains after the etch is completed. For example, it should be understood that the process of etching silicon involves the steps of patterning a photoresist layer above the silicon, and then removing the areas of silicon no longer protected by the photoresist layer. As such, the areas of silicon protected by the photoresist layer would remain behind after the etch process is complete. However, in another example, etching may also refer to a process that does not use a photoresist layer, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, "removing" is considered to be a broad term that may incorporate etching.

The term "substrate," "semiconductor substrate" or "wafer" as described throughout, is most commonly a silicon substrate or a silicon wafer. However, term "substrate" or "wafer" may also refer to any semiconductor material such as germanium, gallium arsenide, indium phosphide, and the like. In other embodiments, the term "substrate" or "wafer" may be non-conductive, such as a glass or sapphire wafer. In addition, the term "capacitor" as used herein refers to a storage node in the architecture of dynamic random access memory (DRAM). It may have different names in other electronic components or memory architecture.

In the drawing of present invention, FIGS. 1A-10B are structure diagrams illustrating the process steps of manufacturing contacts of the present invention, wherein each figure is divided into subgraphs A, B (except FIG. 8) for demonstrating respectively the schematic top view of said step and the schematic cross-sectional view taken along the section line C-C' in the schematic top view of said step and clearly showing the connections between parts and layer structures and the layout of semiconductor plane.

Figure 1B:
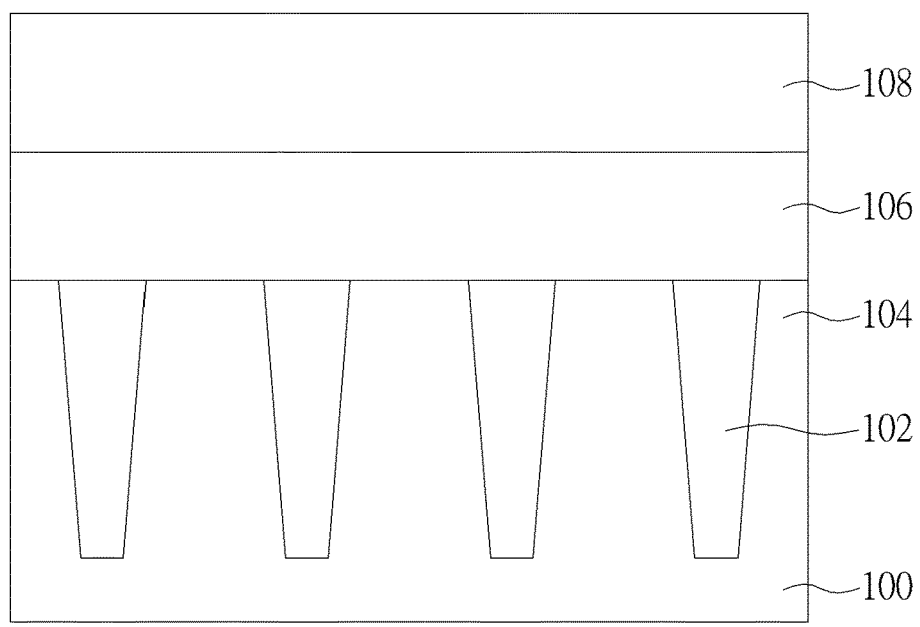
FIG. 1B, FIG. 2B, FIG. 3B, FIG. 4B, FIG. 5B, FIG. 6B, FIG. 7B, FIG. 8, FIG. 9B and FIG. 10B are schematic cross-sectional views corresponding to the above-mentioned top views in accordance with one embodiment of the present invention.

Please refer to FIGS. 1A and 1B. First, prepare a semiconductor substrate 100 which may include cell regions and peripheral regions of memory. Since the feature of present invention does not relate to the peripheral region of memory, all features shown in the figures are in cell regions rather than in peripheral regions. Substrate 100 may be silicon substrate, silicon-on-insulator (SOI) substrate, germanium substrate, germanium-on-insulator (GOI) substrate, silicon-germanium (SiGe) substrate, etc. Isolating structures 102 are formed on the substrate 100 by a method of forming trenches first and then filling in the insulating material, such as silicon oxide, silicon nitride, or silicon oxynitride, etc. Isolating structure 102 defines the active areas 104 in the cell region on the two-dimensional plane.

In the embodiment of present invention, as shown in FIG. 1A, the active areas 104 in two-dimensional plane are in a shape of bar extending in a first direction D1 and are in staggered arrangement on the substrate surface. The active area 104 will be doped beforehand with first type dopants, such as N-type or P-type dopants. In the embodiment, word lines WL are formed beforehand within the substrate 100. In the architecture of recessed gate, word lines are buried within the substrate in a predetermined depth and pass through the isolating structures 102 and active areas 104 in a second direction D2. The second direction D2 is not perpendicular to the first direction D1 of the active area 104. Word line WL functions as a gate to control the switch of storage units, with the material including but not limited to doped semiconductor material (ex. doped silicon), metal (ex. tungsten, aluminum, titanium or tantalum), conductive metal compound (ex. titanium nitride, tantalum nitride or tungsten nitride) or metal-semiconductor compound (ex. metal silicide), etc.

Furthermore, the active areas 104 at two sides of word lines WL may be doped with the second type dopants, such as P-type dopants or N-type dopants, to form source and drain doped regions S/D, wherein the source is at a predetermined position for bit line contact at center of the active area 104, and the drain is at a predetermined position for storage node contact at the end of active area 104. Since the word line is not a critical feature of the present invention, relevant process and details will be herein omitted. For the clarity of drawings, word lines WL will be presented by dashed lines. In addition, since the section line C-C' is drawn to cut through the storage node regions and bit line contact regions rather than the word line regions, the structure of word lines will not be shown in the cross-sectional drawings. Only the critical portions of present invention like storage node contacts and bit line contacts will be shown in the drawing.

As shown in FIG. 1B, an interlayer dielectric (ILD) 106 and a hard mask layer 108, such as a silicon nitride layer and an amorphous layer, are formed on the substrate 100, wherein the interlayer dielectric 106 will be used to contain the desired contacts, and the hard mask layer 108 will serve as a mask in later etch processes. Please note that, in order to clearly present the layout pattern of every portion, the interlayer dielectric 106 and hard mask layer 108 will not be shown in FIG. 1A and other top views.

Figure 2A:
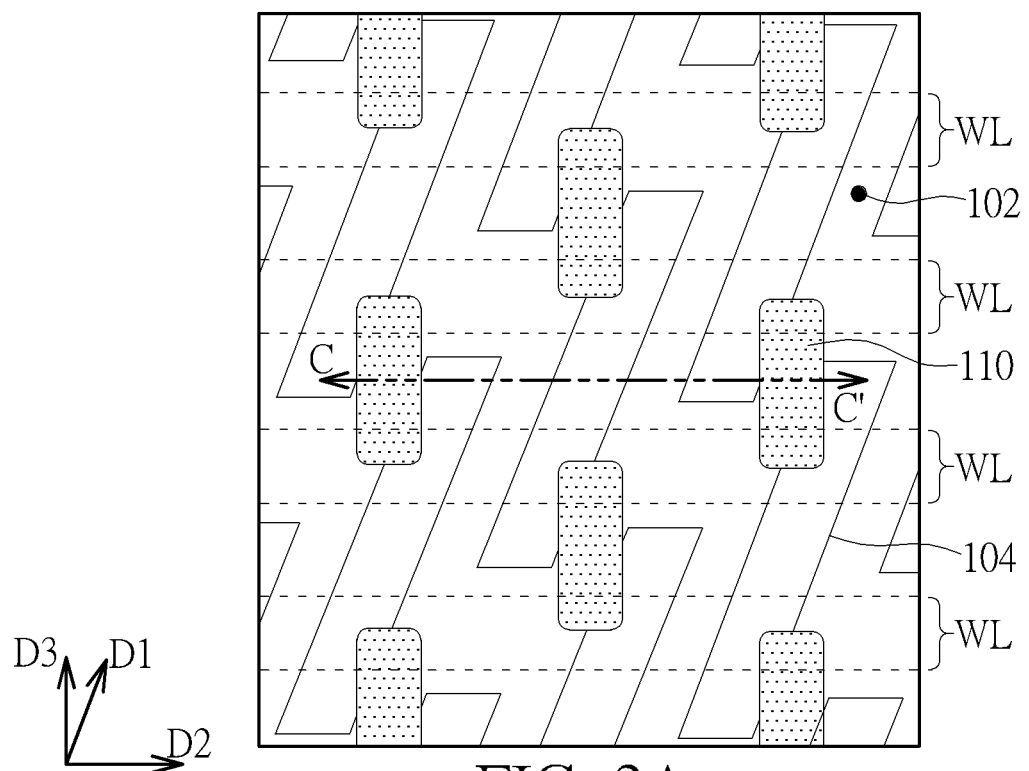
Figure 2B:
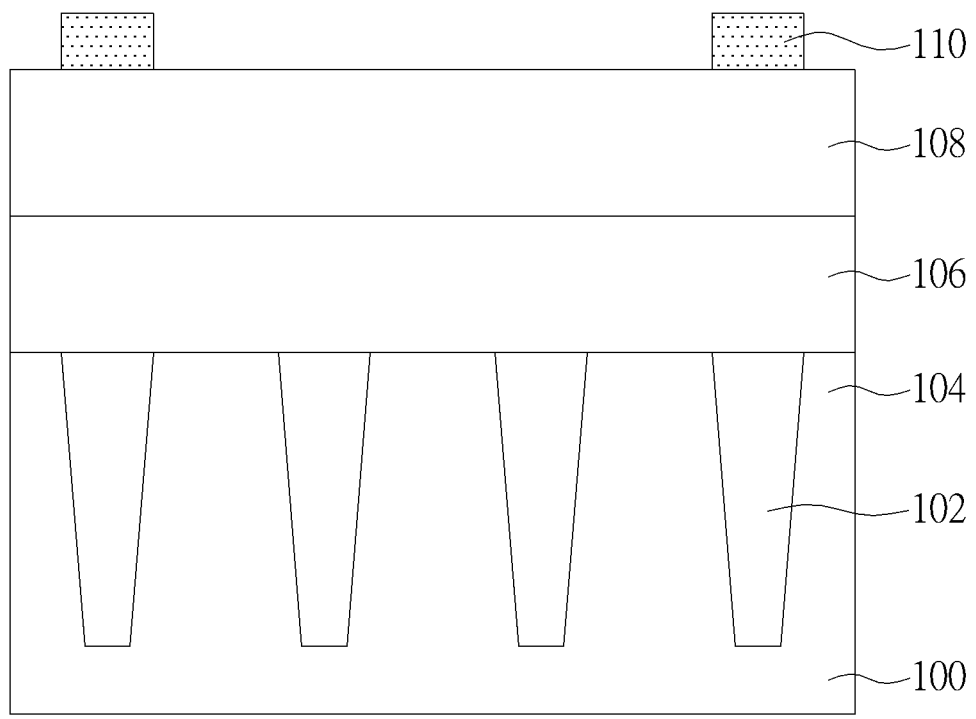

As shown in FIGS. 2A and 2B, after the active areas 104 are defined and the interlayer dielectric 106 and hard mask layer 108 are formed, mask bars 110 are formed on the hard mask layer 108. In the embodiment of the present invention, mask bar 110 is a part of the etch mask that will be used in later processing, and is disposed in advance to separate the approximate positions of contact at two sides of bit line. The position and orientation of mask bars 110 will correspond to the bit lines to be formed in later processing, which extend in a third direction D3 perpendicular to the second direction D2. More specifically, as shown in FIG. 2A, the mask bar is disposed in staggered arrangement between word lines WL and between two ends of adjacent active areas 104. Said end positions are positions of storage nodes and their contacts, which are exactly spaced apart in pairs by the mask bars. The material of mask bar 110 may be silicon oxide and other suitable mask material.

Figure 3A:
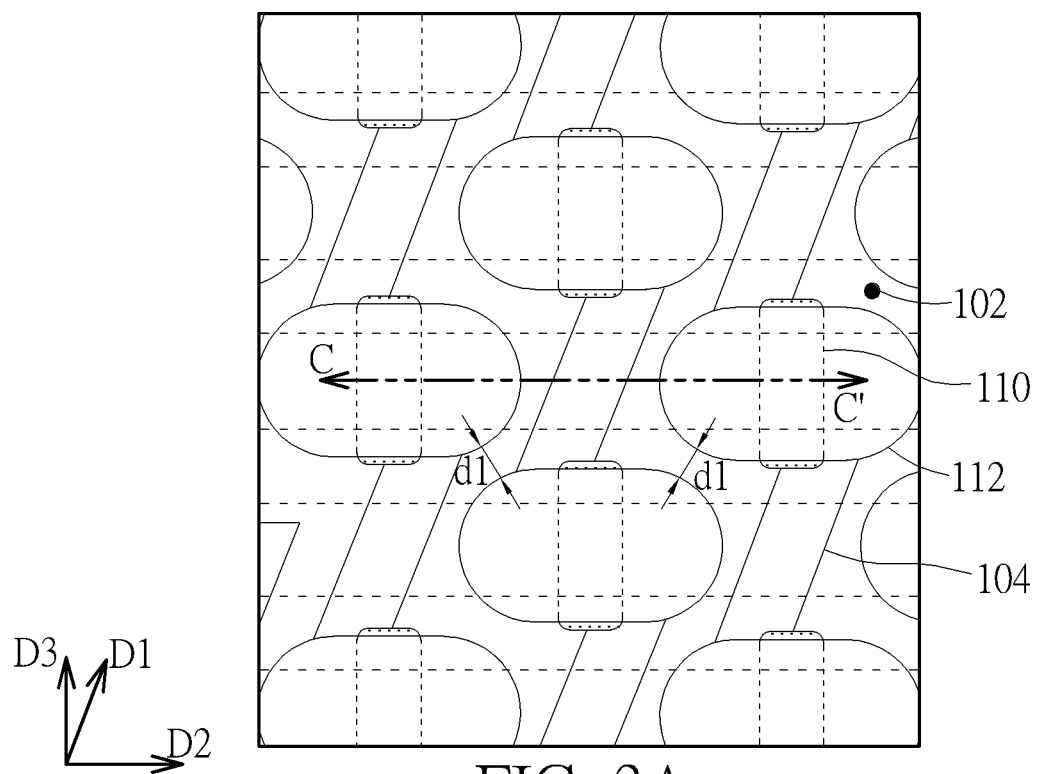
Figure 3B:
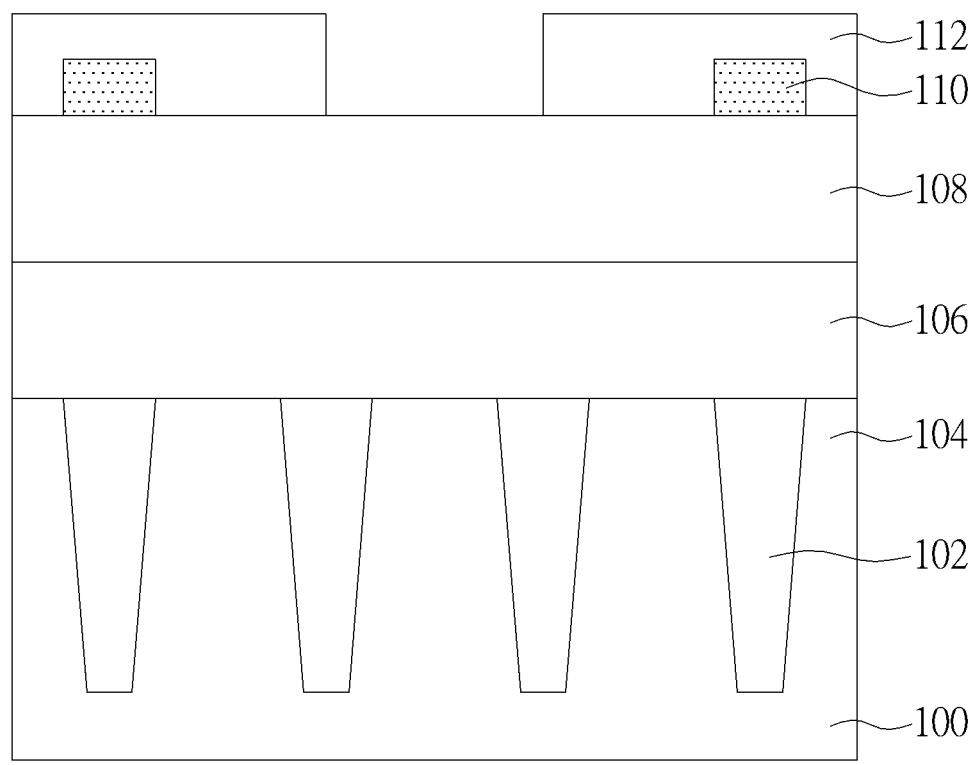

Please refer to FIGS. 3A and 3B. After the mask bars 110 are formed on hard mask layer 108, a mask block 112 is formed on each mask bars 110. As shown in FIG. 3A, the mask block 112 covering the mask bar 110 is an oval shape extending slightly in the second direction D2. The mask bar 110 is positioned right in the midline of the mask block 112, with two ends slightly falling outside the scope of mask block 112. Please note that the mask block 112 may be formed in other shapes in other embodiments, depending on the layout pattern of active areas 104. In the embodiment of the present invention, the size, shape and coverage of the mask block 112 are designed, so that there will be a predetermined spacing d1 defined between adjacent mask blocks 112, especially the spacing along the first direction D1 in which the active area extends. The purpose of this approach is to form spacers on mask blocks 112 in later processing, and these spacers on adjacent mask blocks 112 should merge together at the position of spacing d1 in order to define the desired storage node contact patterns and bit line contact patterns. These steps will be explicitly described in the following embodiment. In this stage, the active areas 104 not covered by the mask blocks 112 will be the predetermined positions of bit line contacts. The mask block 112 may be defined and formed by multilayers of common organic dielectric layer (ODL), silicon-containing hard mask bottom anti-reflection coating (SHB) and photoresist. Relevant details will be herein omitted.

Figure 4A:
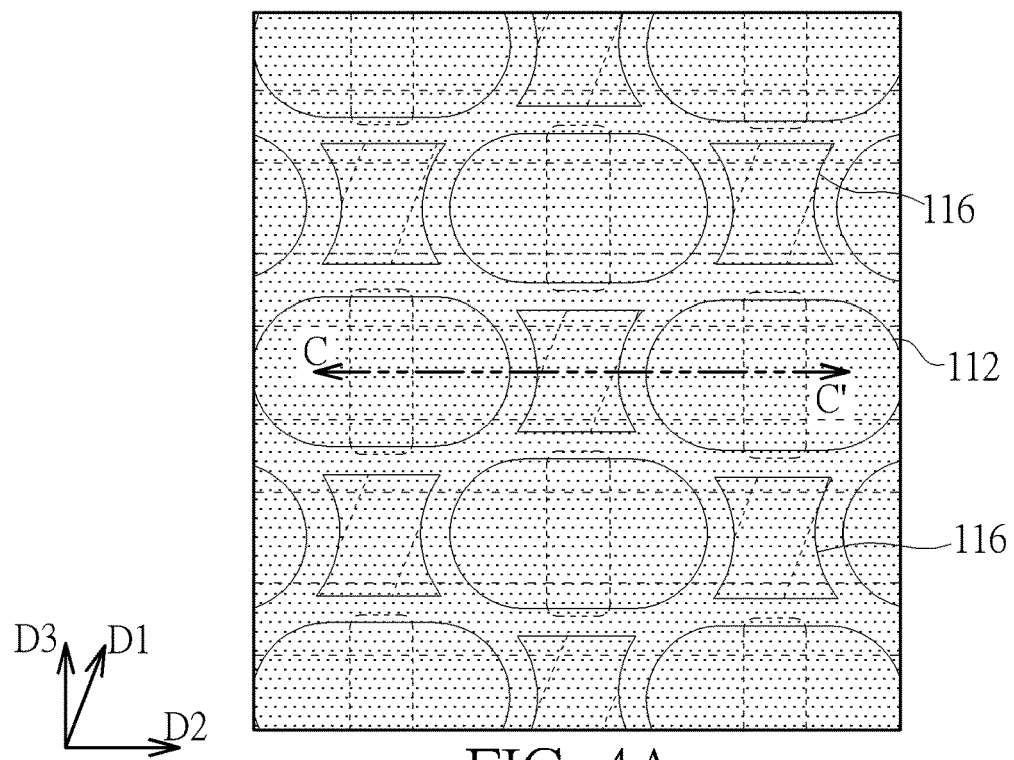
Figure 4B:
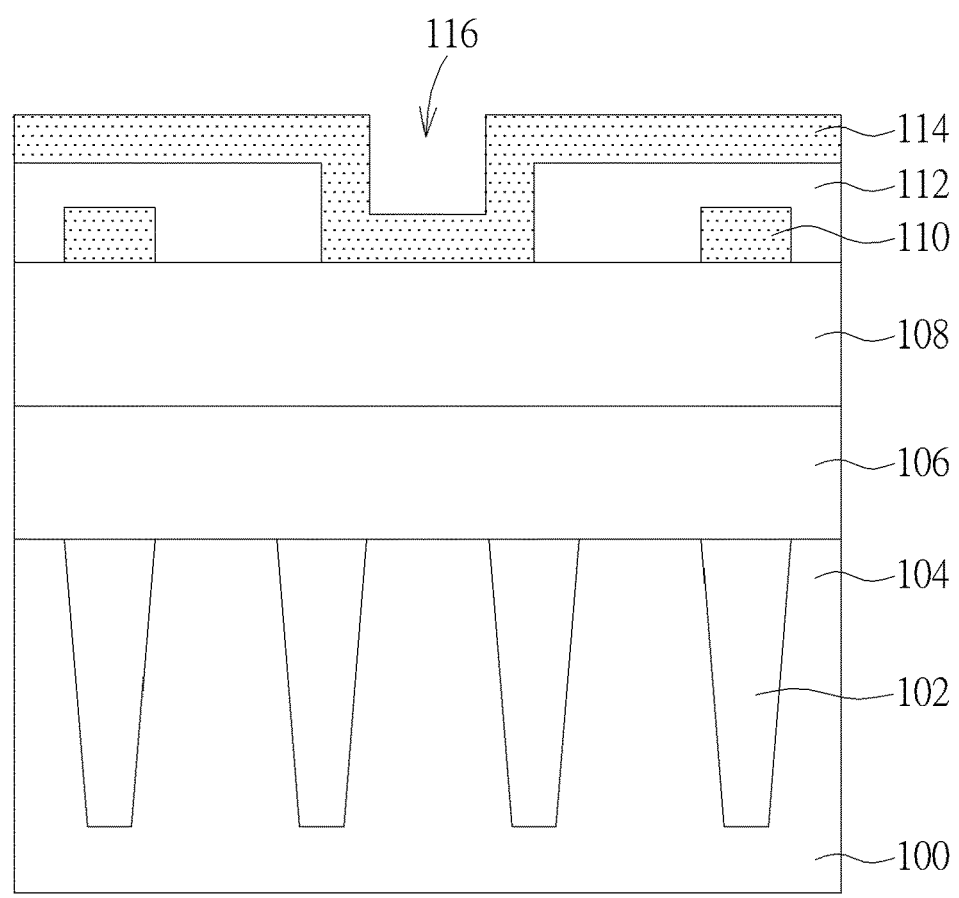

Please refer to FIGS. 4A and 4B. After the mask blocks 112 are formed on the mask bars 110, a conformal spacer layer 114 is formed on each mask block 112. The material of spacer layer 114 may be the same as the one of mask bar 110, such as silicon oxide or other suitable mask material. The thickness of oval mask block 112 may be precisely controlled by atomic layer deposition. As mentioned above, the spacer layers 114 would cover entire substrate and merge together at the positions of predetermined spacing d1 between adjacent mask block 112. In this way, as shown in FIGS. 4A and 4B, recess patterns 116 are defined between non-merged spacer layers 114 between the mask blocks 112. These patterns are substantially the bit line contact pattern to be formed in later processing.

Figure 5A:
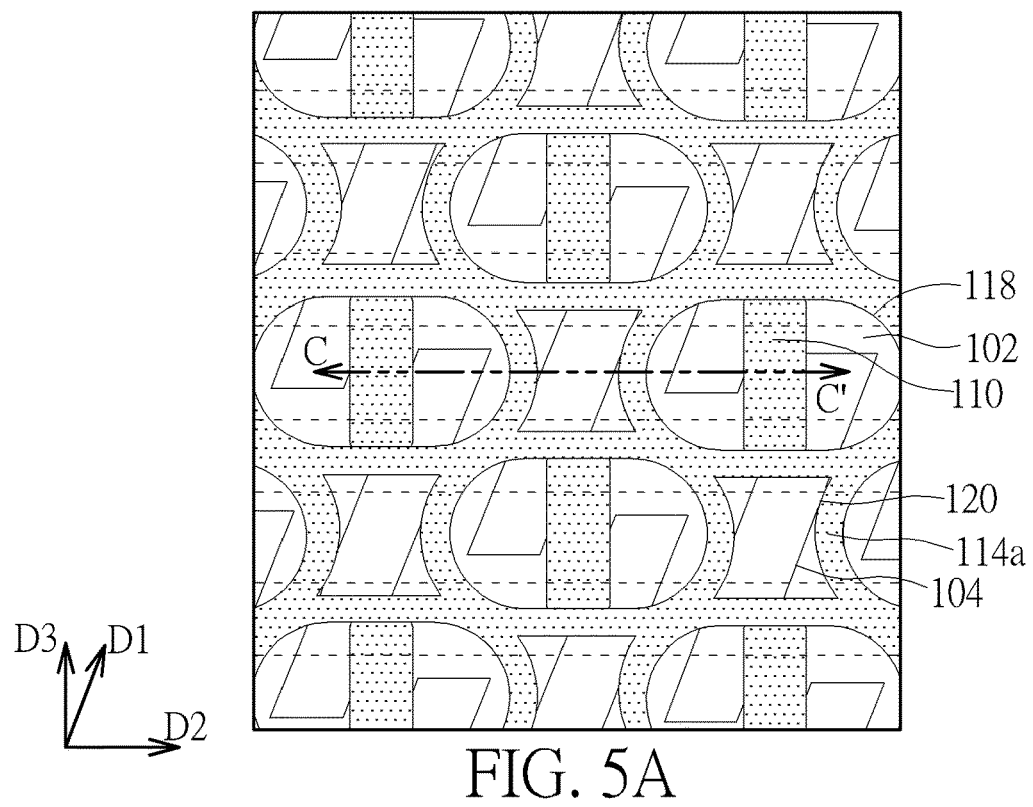
Figure 5B:
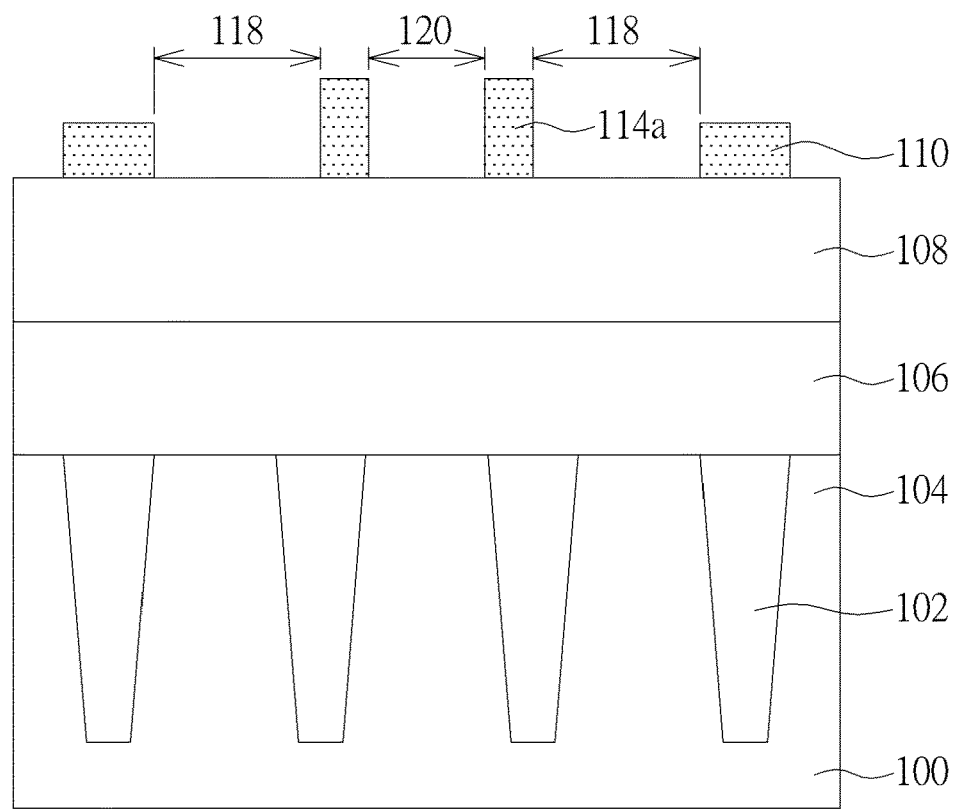

Please refer to FIGS. 5A and 5B. After the conformal spacer layer 114 is formed on the mask blocks 112, an etch process is then performed to remove the spacer layer 114 on the mask block 112 and the mask blocks 112 itself. This etch process may include the following etch steps. First, a first etch process removes the spacer layer 114 of a predetermined thickness so that the mask blocks 112 inside the spacer layer 114 are exposed and the hard mask layer 108 in the recess patterns 116 is also exposed. Then, a second etch process especially and completely removes the mask blocks 112 exposed from the spacer layer 114. Thus only the spacer layers 114 on sidewalls of each mask block 112 (referred hereinafter as spacer 114a) and the mask bars 110 formed in previous process remain on the hard mask layer 108.

In the embodiment of the present invention, the spacer 114a and the mask bar 110 have same material and serve collectively as an etch mask, wherein each mask bar 110 and the spacer 114a surrounding therearound define two storage node contact patterns 118, as the semicircular-like patterns shown in the figure. Each two storage node contact patterns 118 are separated by a mask bar 110 and correspond to the storage nodes at the ends of active area 104 thereunder, while the bit line contact patterns 120 are defined between spacers 114a and correspond to the bit line contact portion at the center of active area 104 thereunder.

Figure 6A:
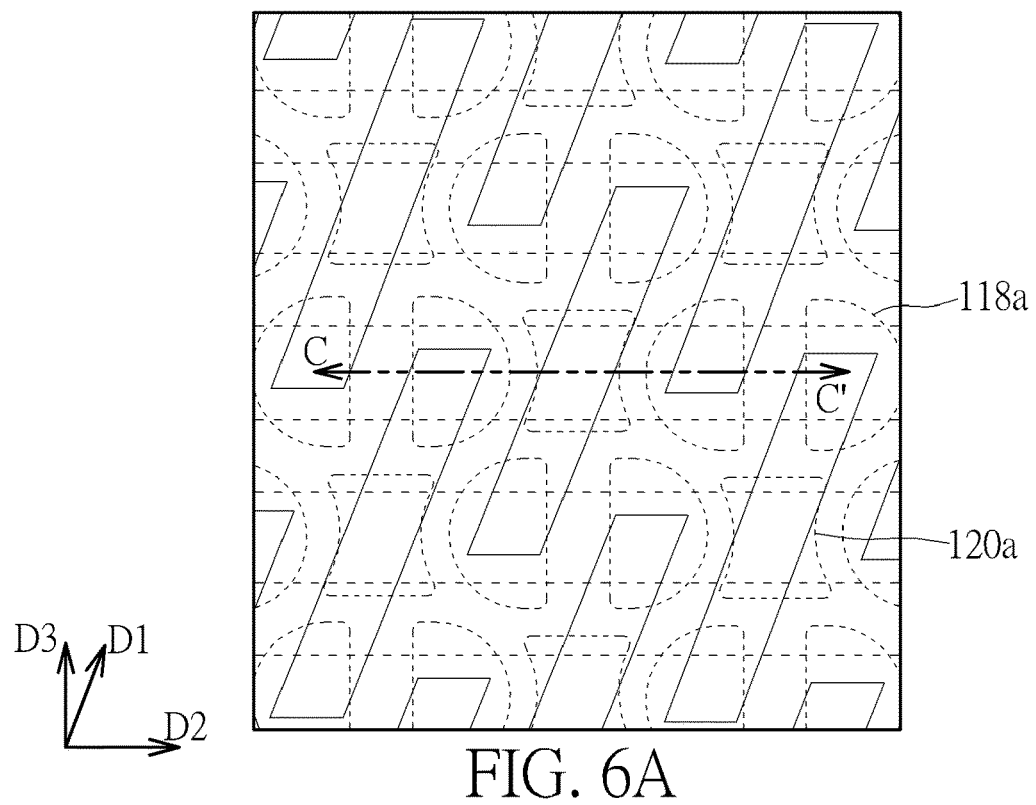
Figure 6B:
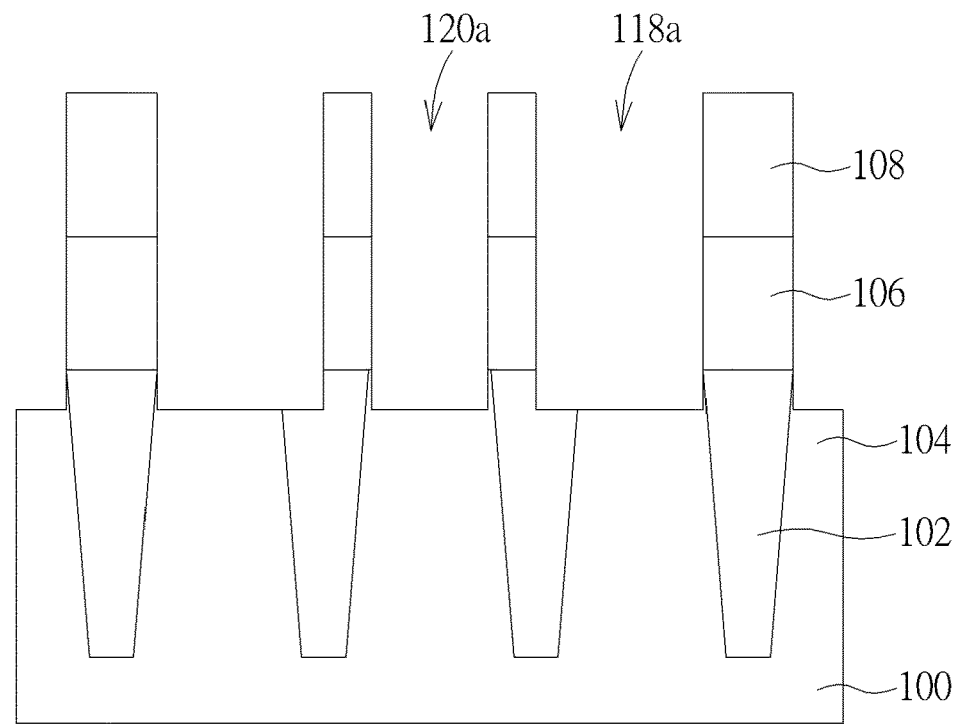

Please refer to FIGS. 6A and 6B. After the etch masks made up of mask bars 110 and spacers 114a are formed on the hard mask layer 108, an etch process is performed using mask bars 110 and spacers 114a as an etch mask to transfer the storage node contact patterns 118 and the bit line contact patterns 120 defined by the mask bars 110 and spacers 114a to the hard mask layer 108 thereunder, thereby forming storage node contact recesses 118a and bit line contact recesses 120a in the interlayer dielectric 106. Please note that, as shown in FIG. 6B, the aforementioned etch steps may remove a portion of the active area 104 and isolating structure 102, wherein every storage node contact recess 118a and bit line contact recess 120a will correspond respectively to the positions of active areas 104 thereunder. As shown in FIG. 6A, after the storage node contact pattern 118 and the bit line contact pattern 120 are transferred to form the storage node contact recess 118a and the bit line contact recess 120a, the pattern corner of is rounded and rendered to a smooth outline, but is limited thereto.

In the embodiment of the present invention, since the storage node contact recess 118a and the bit line contact recess 120a are formed by removing interlayer dielectric 106 in the same etch process, the bottoms of two contact recesses will be at the same level. The feature like this is different from the feature in prior art that the bit line contact recess is deeper than the storage node contact recess to prevent the connection of the bit line contact and the storage node contact. Furthermore, since the present invention uses preformed etch masks (i.e. mask bars 110 and spacers 114a) in the etch process to simultaneously form the storage node contact recesses 118a and the bit line contact recesses 120a, the issue of overlay shift caused by different recess processes in prior art will not occur, and the problems of low overlay window and short circuit due to small spacing between bit line contact and storage node contact in current high-integrity circuit design may be successfully solved.

Figure 7A:
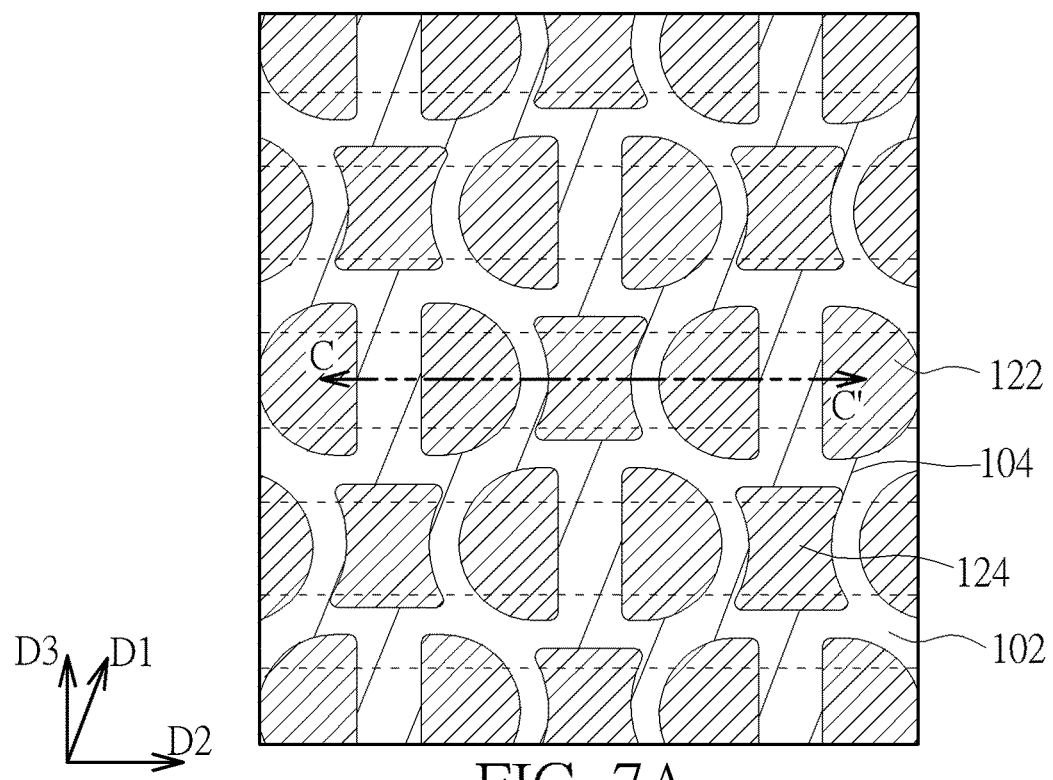
Figure 7B:
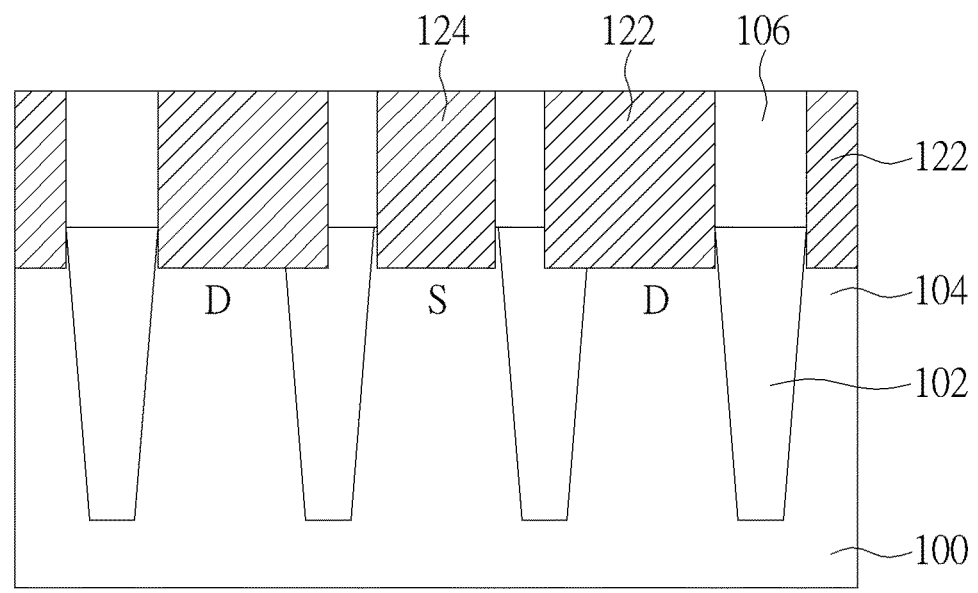

Please refer to FIGS. 7A and 7B. After the storage node contact recesses 118a and the bit line contact recesses 120a are formed in the interlayer dielectric 106, conductive material is then filled into the storage node contact recesses 118a and the bit line contact recesses 120a to form storage node contacts 122 and bit line contacts 124 respectively, and which further connect respectively to drain doped region D and source doped region S preformed thereunder. In the embodiment of the present invention, the storage node contact 122 and the bit line contact 124 may have a same material, which include but not limited to doped semiconductor material (ex. doped silicon), metal (ex. tungsten, aluminum, titanium or tantalum), conductive metal compound (ex. titanium nitride, tantalum nitride or tungsten nitride) or metal-semiconductor compound (ex. metal silicide), etc. The process of forming these contacts may include forming a conductive layer on the substrate to fill up the storage node contact recesses 118a and bit line contact recesses 120a, and a planarization process, such as a chemical mechanical polishing (CMP) process, is then performed to remove the unnecessary conductive material and hard mask layer 108 on the interlayer dielectric 106, thereby forming the storage node contacts 122 and the bit line contacts 124 with top surfaces flush with surrounding interlayer dielectric 106 as shown in FIG. 7B.

The interlayer dielectric 106 and the isolating structure 102 would provide excellent insulation between these contacts to prevent short circuit issue. Please note that conventional bit line contact would go deeper into the substrate than the adjacent storage node contacts rather than have a same bottom level, and these two kinds of contacts would get closer to each other. As mentioned in previous embodiment, this same bottom level feature in the present invention may be attributed to the simultaneous formation of these two different contacts, and the problem of narrow overlay window and short circuit are therefore solved.

Figure 8:
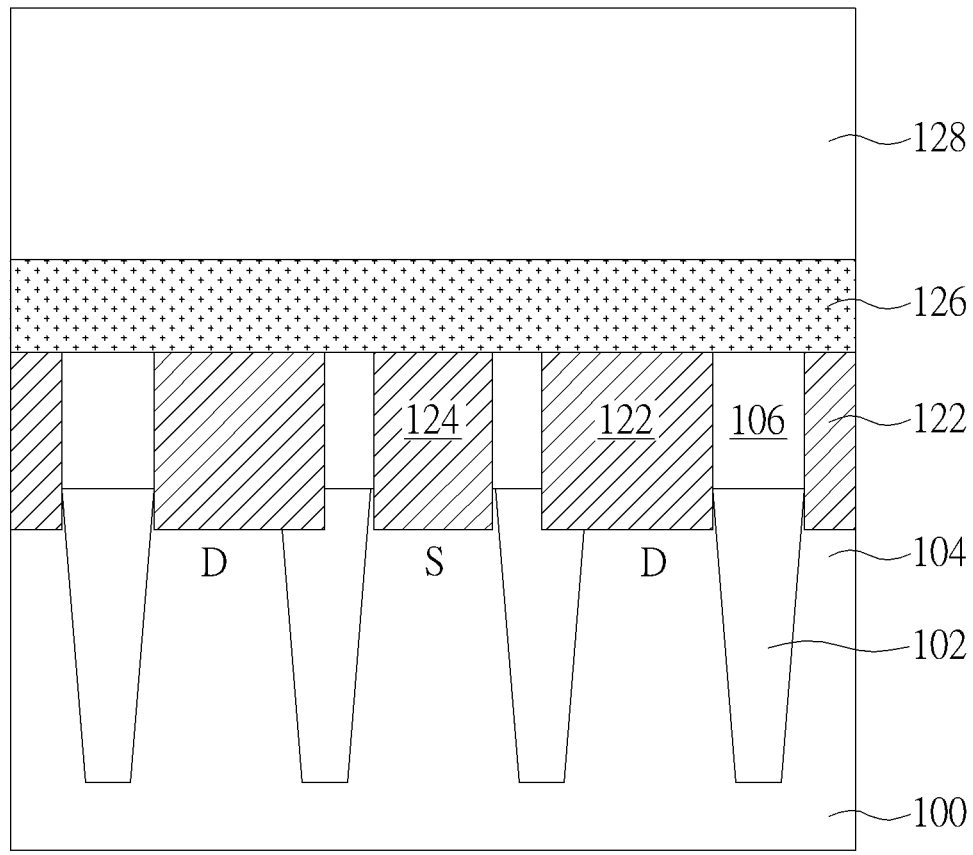

Please refer to FIG. 8. The formation of bit lines is started after the storage node contacts 122 and the bit line contacts 124 are formed. First, a metal layer 126 and an insulating layer 128 are subsequently formed on the contacts and the substrate. The metal layer 126 is used to form bit lines, with the material of tungsten, aluminum, titanium, or tantalum, etc. The insulating layer 128 is a thicker layer, with the material of silicon nitride, silicon oxide, or silicon oxynitride, etc. The insulating layer 128 may serve as a molding structure to define the size and length of contact plug to be formed in later processing and provide insulating efficacy therebetween.

Figure 9A:
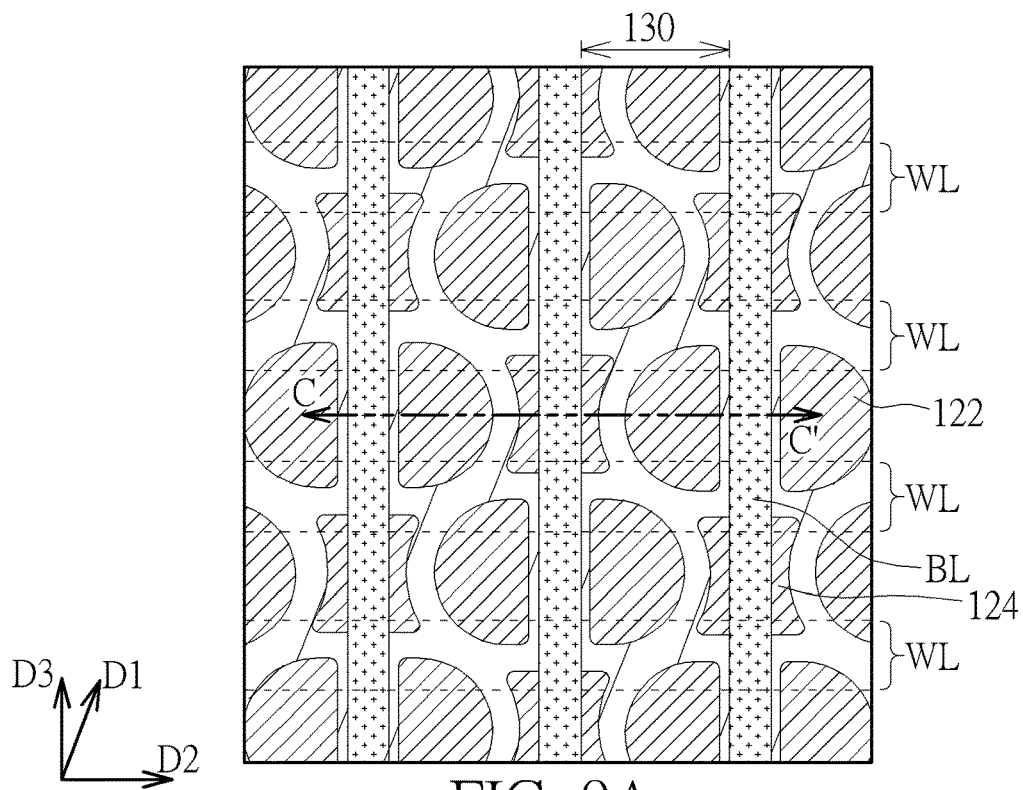
Figure 9B:
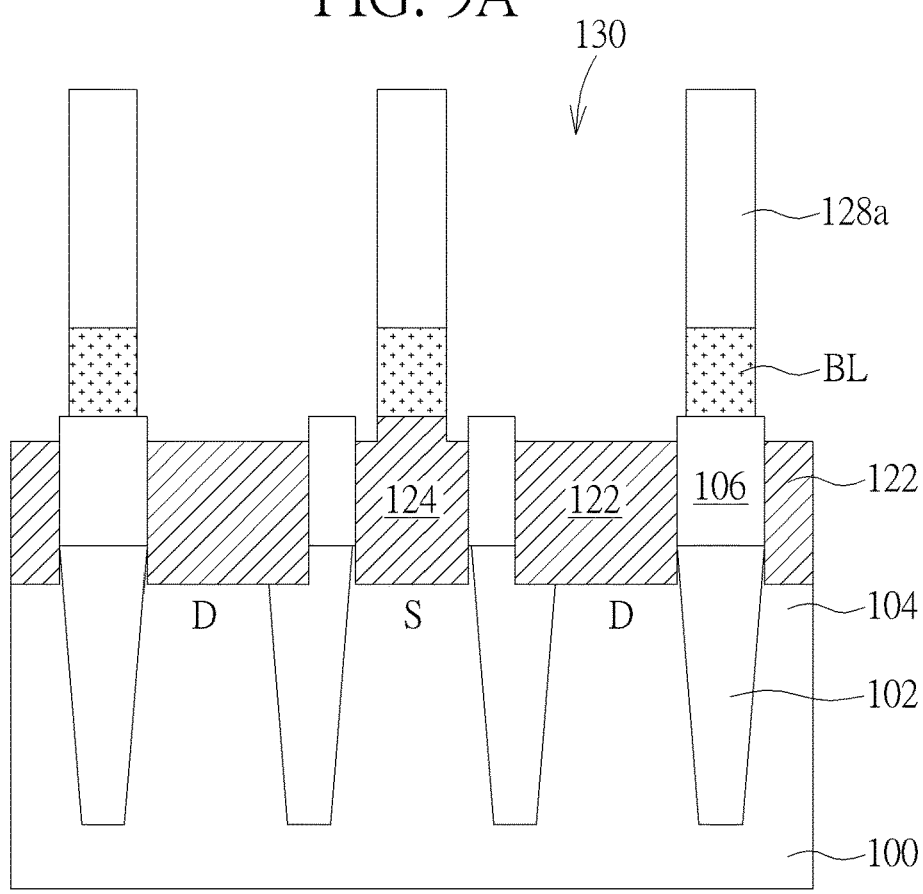

Please refer to FIGS. 9A and 9B. After the metal layer 126 and the insulating layer 128 are formed on the contacts, a photolithographic and etch process is performed to pattern the metal layer 126 and the insulating layer 128 into bit lines BL. As shown in FIG. 9A, bit line BL extends in the third direction D3 and perpendicularly intersects the word line WL formed in a previous process. The bit line BL would extend right above the bit line contacts 124 and through the active area 104 between two storage node contacts 122. Thus, bit line BL would electrically connect with the bit line contact 124 rather than the adjacent storage node contacts 122. Please note for the clarity of description, the insulating layer 128a right above the bit line BL is not shown in FIG. 9A.

On the other hand, as shown in FIG. 9B, the insulating layer 128a may also serve as a molding layer to define recesses between bit lines with predetermined depth. These recesses will be used to contain desired contact plugs to be formed in later process. Please note that the aforementioned etch process would remove a portion of the storage node contact 122 and bit line contact 124, so that their top surface would be slightly lower than the surrounding interlayer dielectric 106. This approach may help to prevent the short circuit between the bit line contact 124 and the contact plug to be formed in later process.

Figure 10A:
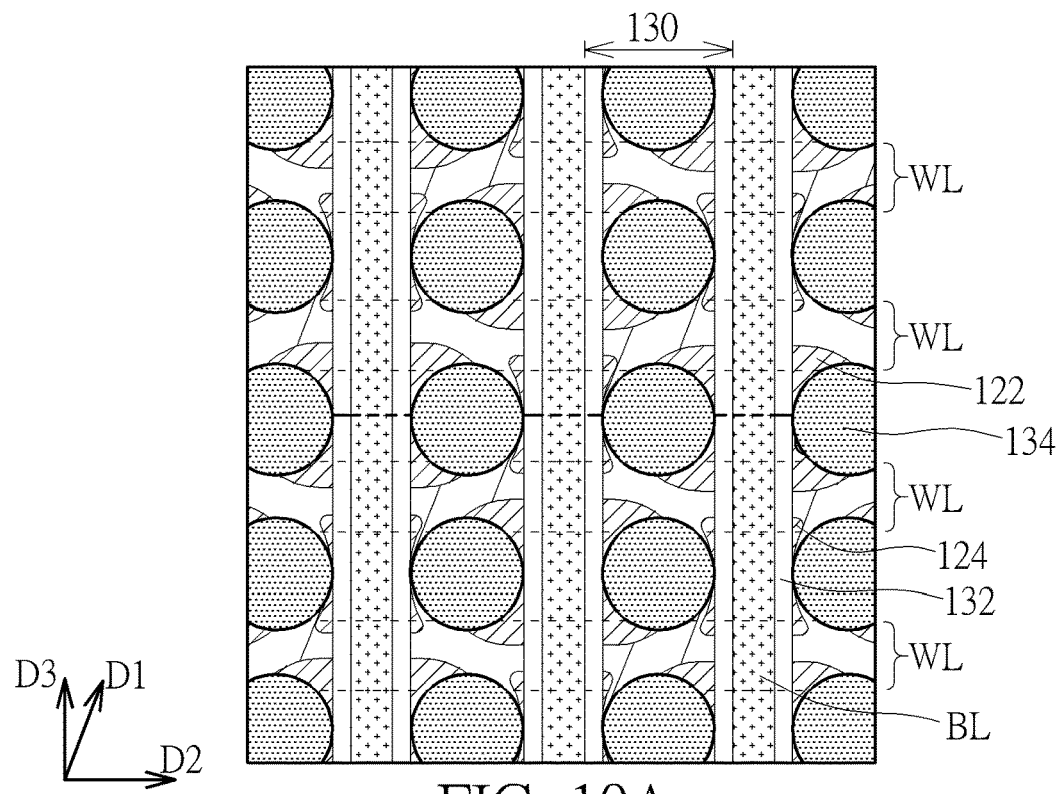
Figure 10B:
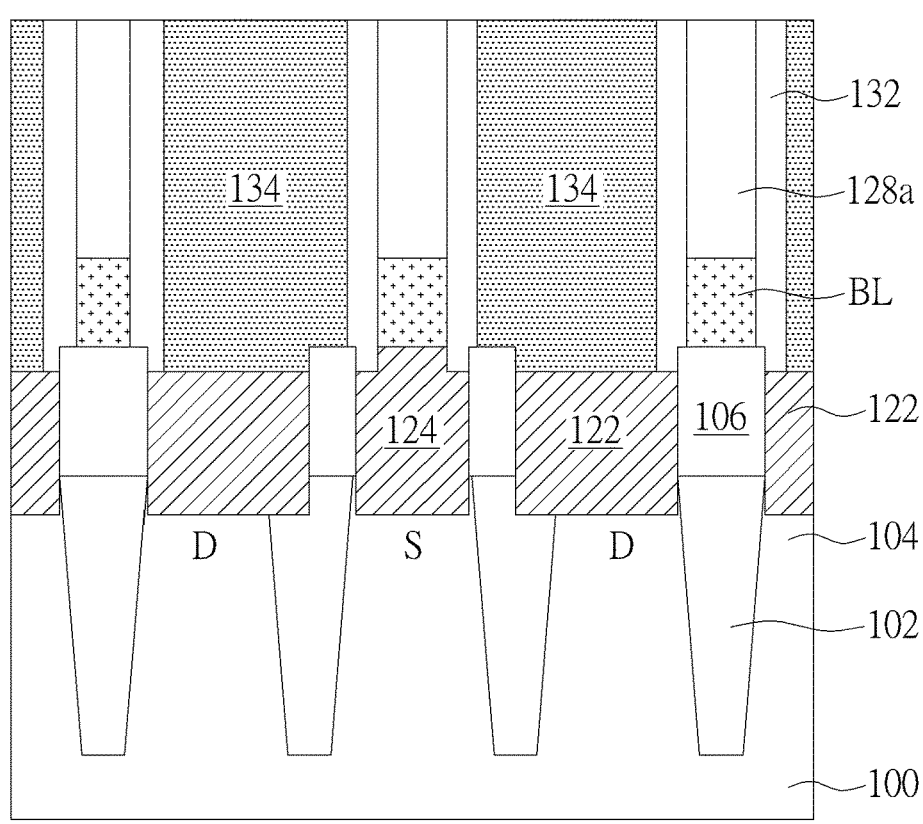

Please refer to FIGS. 10A and 10B. The formation of contact plugs adjacent to the bit lines BL is started after the bit lines BL are formed. First, in order to isolate the bit lines BL and adjacent contact plugs to be formed in this process, an insulating spacer layer 132 is first formed on sidewalls of bit lines BL and the insulating layer 128a. As shown in FIG. 10B, in addition to bit lines BL and insulating layer 128a, the spacer layer 132 would also cover the interlayer dielectric 106 at two sides of the bit line contacts 124 and fill into the recesses therebetween to achieve the insulating efficacy. The material of spacer layer 132 may include but not limited to silicon nitride, silicon oxide, or silicon oxynitride, etc. Alternatively, it may be a multilayer structure.

After the spacer layer 132 is formed, the contact plugs are formed in the recesses 130 between the spacer layers 132. Each contact plug would electrically connect with the storage node contact 122 thereunder, with the spacer layer 132 and interlayer dielectric 106 to provide isolation against the bit lines BL and bit line contacts 124. Subsequently, in order to define the pattern of contact plug, a molding layer is necessary in the second direction D2 to confine the position of every contact plug collectively with the insulating layer 128a in the first direction D1. The relevant process may include filling a sacrificial layer into the recesses 130, and then defining and forming the molding layer on the word line WL in the sacrificial layer. The molding layer has same orientation as the word line WL and may have a same material as the one of insulating layer 128a. The sacrificial layer is then removed and the defined plug spaces or plug holes are filled with plug material, thereby forming the contact plugs 134 as shown in FIG. 10A. Please note that the contact plug 134 may be formed by using other different processes, and it may further electrically connect to the capacitor pad and storage capacitor (not shown) to be formed thereon. Since relevant processes for manufacturing the contact plugs 134 and their interconnections are all conventional skills and are not the critical features of present invention, those descriptions will be herein omitted to prevent the obscuring of the present invention. To simplify the drawings, only the layout and cross-sections of contact plugs 134 and corresponding storage node contacts 122 are shown in the figures. So far, the upper contact plug 134 and the lower storage node contact (may also referred as contact pad) 122 may be considered as a complete contact structure of the storage node.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A contact, comprising:
   a substrate with a plurality of active areas isolated by isolating structures;
   an interlayer dielectric directly on said isolating structures;
   a plurality of bit line contacts in said interlayer dielectric and connecting with said active areas;
   a plurality of storage node contacts in said interlayer dielectric and connecting with said active areas and said isolating structures, wherein one of said storage node contacts is provided at two sides of each of said bit line contacts and is isolated from said one of bit line contacts by said interlayer dielectric, and the bottom of said one of storage node contacts is level with the bottom of said each of bit line contacts;
   a plurality of bit lines on said plurality of bit line contacts and connecting with said plurality of bit line contacts, wherein said plurality of storage node contacts are between said plurality of bit lines; and
   spacer layers on sidewalls of said one of bit lines and on said interlayer dielectric.

2. The contact of claim 1, wherein said each of bit line contacts is on the center of said one of active areas, and every two of said storage node contacts are on two opposite ends of said one of active areas respectively.

3. The contact of claim 1, further comprising a plurality of word lines formed within said substrate and perpendicular to said plurality of bit lines, wherein said plurality of bit line contacts and said plurality of storage node contacts are between said plurality of word lines.

4. The contact of claim 1, further comprising a contact plug on said each of storage node contacts.

* * * * *